United States Patent
Takada

(10) Patent No.: US 7,310,213 B2
(45) Date of Patent: Dec. 18, 2007

(54) SEMICONDUCTOR DEVICE PROVIDED WITH OVERHEAT PROTECTION CIRCUIT AND ELECTRONIC CIRCUIT USING THE SAME

(75) Inventor: Kouji Takada, Kameoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 375 days.

(21) Appl. No.: 10/948,693

(22) Filed: Sep. 24, 2004

(65) Prior Publication Data

US 2005/0068707 A1    Mar. 31, 2005

(30) Foreign Application Priority Data

Sep. 26, 2003   (JP) .............................. 2003-334520

(51) Int. Cl.
*H02H 5/04* (2006.01)
(52) U.S. Cl. ...................................... 361/103
(58) Field of Classification Search ................ 361/103, 361/106, 93.9
See application file for complete search history.

(56) References Cited

U.S. PATENT DOCUMENTS

| | | | |
|---|---|---|---|
| 3,223,851 A * | 12/1965 | Kitchens et al. | 327/78 |
| 4,049,978 A * | 9/1977 | Dru et al. | 326/88 |
| 4,345,253 A * | 8/1982 | Hoover | 342/44 |
| 4,760,434 A * | 7/1988 | Tsuzuki et al. | 257/49 |
| 6,255,892 B1 * | 7/2001 | Gartner et al. | 327/512 |
| 6,380,570 B1 * | 4/2002 | Voldman | 257/288 |
| 6,633,473 B1 | 10/2003 | Tomomatsu | |

FOREIGN PATENT DOCUMENTS

| | | |
|---|---|---|
| JP | 63102248 | 5/1988 |
| JP | 63229757 | 9/1988 |
| KR | 2001107980 | 12/2001 |

OTHER PUBLICATIONS

DC Biasing. Doug Gingrich. Jul. 13, 1999. <http://www.phys.ualberta.ca/~gingrich/phys395/notes/node82.html>.*
Chinese Office Action dated Oct. 13, 2006 with English translation.
Korean Office Action dated Apr. 25, 2006 with English translation.

* cited by examiner

*Primary Examiner*—Michael Sherry
*Assistant Examiner*—Christopher J Clark
(74) *Attorney, Agent, or Firm*—Stevens, Davis, Miller & Mosher, LLP

(57) ABSTRACT

A overheat protection circuit is formed on the same semiconductor substrate as a power MOS FET is formed on. As the configuration, a first resistor is connected between an input terminal and a gate of the power MOS FET, a second resistor, a temperature sensing element, and a third resistor are connected in this order between the input terminal and a ground point, an FET for clamp is connected in parallel to a series circuit of the temperature sensing element and the third resistor, a series circuit of an FET for current adjustment and a fourth resistor is connected in parallel to the MOS FET for clamp, a series circuit of a fifth and sixth resistors is connected between the input terminal and the ground point, a node of the fifth and sixth resistors is connected to a gate of the FET for current adjustment, an FET for switching is connected between the gate of the power MOS FET and the ground point, and a node of the temperature sensing element and the third resistor is connected to a gate of the FET for switching.

22 Claims, 6 Drawing Sheets

SEMICONDUCTOR DEVICE PROVIDED WITH OVERHEAT PROTECTION CIRCUIT AND ELECTRONIC CIRCUIT USING THE SAME

BACKGROUND OF THE INVENTION

1. Field of the Invention

The present invention relates to a semiconductor device provided with a power semiconductor element, and an electronic circuit using this semiconductor device, and particularly to a semiconductor device having an overcurrent protection function. A semiconductor device according to the present invention is particularly useful as a semiconductor device provided with a power semiconductor element when an overheat protection for the element is required.

2. Description of the Related Art

As a prior art of a semiconductor device provided with a power semiconductor element, a configuration provided with an overheat protection function is disclosed by Japanese Laid-Open Patent Application Publication No. 63-229757. FIG. 6 is a circuit schematic diagram for explaining a semiconductor device related to the prior art disclosed by Japanese Laid-Open Patent Application Publication No. 63-229757.

A power semiconductor element 11 which is comprised of a power MOSFET controls an electric power supplied to a load 12 (resistor RL) from a power supply 13 (voltage Vdd). Then, in order to protect such power semiconductor element 11, an overcurrent protection portion 14 and a temperature protection portion 15 are formed on the same semiconductor substrate, on which this power semiconductor element 11 is formed.

The overcurrent protection portion 14 described above has a transistor 141 which is comprised of a power MOSFET. This transistor 141 comprises a power MOS FET, only a source electrode of which is isolated from the power semiconductor element 11 in a small areas of $\frac{1}{100}$ through $\frac{1}{3000}$ among an area of the power MOS FET which forms the above power semiconductor element 11, and which has a configuration common to that of the power semiconductor element 11 other than that. In other words, a voltage Vin supplied to a driving signal input terminal is supplied to gates of the power MOS FETs which form the power semiconductor element 11 and the transistor 141 described above in common via a resistor R11 as a potential Va of a point A. In addition, the drain electrodes of the power semiconductor element 11 and the transistor 141 described above are connected to the load 12 in common.

Then, the source electrode of this transistor 141 is grounded via a resistor R12. A drain of a transistor 142 is connected to the point A used as the gate of the transistor 141. This transistor 142 is controlled by a potential Vb of a point B used as a terminal voltage of the above resistor R12. Accordingly, when an overcurrent flows to the power semiconductor element 11, a current proportional to the overcurrent flows to the transistor 141, and when the potential of the point B is thereby increased, the transistor 142 turns on to lower the potential of the point A. As a result, the current which flows to the power semiconductor element 11 is restricted.

The temperature protection portion 15 described above comprises a temperature sensing element 151 to which the above input voltage Vin is supplied via a resistor R13, and this temperature sensing element 151 is grounded via a resistor R14. The temperature sensing element 151 comprises a series circuit of a plurality of polysilicon diodes.

Then, a zener diode 152 is connected in parallel to a series circuit of the temperature sensing element 151 and resistor R14 described above, and a constant voltage is applied to the series circuit of the temperature sensing element 151 and the resistor R14 described above.

In addition, a transistor 153 is arranged in this temperature protection portion 15, this transistor 153 is connected between the above point A and the ground point, and a gate electrode thereof is connected to a node C of the temperature sensing element 151 and the resistor R14 described above.

Herein, description will be made of an operation of the above temperature protection portion 15. When the power semiconductor element 11 generates heat and a temperature of the semiconductor substrate increases, the temperature sensing element 151 will detect this temperature rise. More specifically, when the temperature of the semiconductor substrate increases, a voltage across terminals of the temperature sensing element 151 is decreased, and the potential Vc of the point C is also increased in connection with it. Then, when the temperature of the semiconductor substrate increases not less than a predetermined temperature, and the potential Vc becomes not less than a threshold voltage of the transistor 153, a channel will be formed in this transistor 153 and the transistor 153 will turn on. As a result, the potential Va of the point A will drop. The power semiconductor element 11 will therefore be turned off and this power semiconductor element 11 is protected from thermal destruction.

The above semiconductor device for power is generally driven with system LSIs or microcomputers. In recent years, in accordance with the trend of energy saving, a supply voltage to these system LSIs and microcomputers is becoming further lower from a voltage of 5 V to a voltage of not more than 3 V. In a conventional overheat protection circuit, since the overheat protection is not applied at a constant value in a wide voltage range including the voltage outside 3 V through 5V, both inclusive, for example a range of 1 V through 6 V; it is difficult to obtain sufficient reliability.

The reason is as follows. In order for the overheat protection operation to operate normally according to the voltage across the terminals of the temperature sensing element 151, it is required that a constant voltage is applied to the series circuit of the temperature sensing element 151 and the resistor R4, and the potential Vc of the point C becomes a certain setting value at a predetermined temperature.

However, a zener voltage of the zener diode 152 which determines a voltage of this series circuit is fixed to a constant value while being manufactured. When the zener voltage is set according to an upper limit of the input voltage range, if a voltage significantly lower than the zener voltage is supplied to the driving signal input terminal, a voltage across terminals of the zener diode 152 will drop according to the input voltage.

Therefore, the voltage applied to the series circuit of the temperature sensing element 151 and the resistor R4 will drop, and the potential Vc will also drop lower than the setting value. In such a state, even when the temperature of the semiconductor substrate increases and the voltage across the terminals of the temperature sensing element 151 decreases to a value, at which the overheat protection operates, the potential Vc of the point C has not reached the threshold value of the transistor 153, so that the transistor 153 does not turns on, and the voltage Va of the point A does not drop, thereby the power semiconductor element 11 is not turned off.

In this case, the temperature rises not less than the setting value, and the overheat protection operation is not performed until a rise of the potential Vc due to a decrease of the voltage across the terminals of the temperature sensing element 151 exceeds the threshold of the transistor 153.

For example, supposing that the input voltage is on the order of 5 V and the overheat temperature protection value is 140° C., when the input voltage becomes low on the order of 3 V, due to above reason, the substrate temperature reaches 200° C. at the lowest, and exceeds a guaranteed junction temperature 150° C. of the semiconductor, so that it is considered that reliability thereof is remarkably damaged. On the other hand, when the zener voltage is set according to a lower limit of the input voltage range, the problem described above does not arise.

However, in order to reduce the zener voltage, it is necessary to increase field strength of a PN junction. Specifically, it is necessary to make concentrations of an N type impurity and a P type impurity which are implanted into the substrate high, and for example, when making a zener diode having a zener voltage on the order of 1 V to 2 V, the concentration of each impurity becomes too high, thereby making it extremely difficult to manufacture the same. In particular, under diffusion conditions where the power semiconductor element is manufactured, it is impossible to manufacture such diodes simultaneously.

SUMMARY OF THE INVENTION

The present invention has been made in view of the problems described above, and the object thereof is to provide a semiconductor device capable of achieving sufficient reliability so that an overheat protection may be applied at a constant temperature value in a wide input voltage range, and an electronic circuit using the same.

In order to solve the problems described above, a semiconductor device of the present invention comprises: a power semiconductor element, which has a control terminal and is formed on a semiconductor substrate; and a overheat protection circuit, which is arranged between the control terminal of the power semiconductor element and a ground terminal, and is formed on the semiconductor substrate.

The overheat protection circuit comprises: a driving signal input terminal, to which a driving signal for driving the power semiconductor element is supplied; a first resistor connected between the driving signal input terminal and the control terminal of the power semiconductor element; a second resistor, one end of which is connected to the driving signal input terminal; a semiconductor element for temperature sensing, which has a high potential side terminal connected to the other end of the second resistor, and has a low potential side terminal, and changes a voltage across the high potential side terminal and the low potential terminal according to a temperature change of the semiconductor substrate; a third resistor connected between the low potential side terminal of the semiconductor element for temperature sensing and the ground terminal; a semiconductor element for switching, which has a control terminal connected to the low potential side terminal of the semiconductor element for temperature sensing, and has two main terminals connected to the control terminal of the power semiconductor element and the ground terminal respectively; a semiconductor element for clamp, which has a high potential side terminal connected to the other end of the second resistor, and has a low potential side terminal connected to the ground terminal, and keeps a voltage between the high potential side terminal of the semiconductor element for temperature sensing and the ground terminal at an almost constant voltage; and a current stabilizing circuit, which keeps a current flow amount into the high potential side terminal of the semiconductor element for clamp at an almost constant level.

The overheat protection circuit described above is preferably configured so that when the semiconductor element for switching turns on, a potential of the control terminal of the power semiconductor element may be lowered, and operation of the power semiconductor element may be stopped.

In addition, the above semiconductor element for clamp is preferably configured using an MOS FET, the drain and the gate of which is commonly connected. In addition, the power semiconductor element is also preferably configured using an MOS FET.

The current stabilizing circuit described above preferably comprises: a transistor for current bypass, the drain of which is connected to the high potential side terminal of the semiconductor element for clamp; a fourth resistor connected between a source of the transistor for current bypass and the ground terminal; a fifth resistor connected between the driving signal input terminal and a gate of the transistor for current bypass; and a sixth resistor connected between the gate of the transistor for current bypass and the ground terminal.

In addition, the current stabilizing circuit described above may comprises: a transistor for current bypass, the drain of which is connected to the high potential side terminal of the semiconductor element for clamp, and the source of which is connected to the ground terminal, and which functions as an output side element of a current mirror; a fourth resistor, one end of which is connected to the driving signal input terminal; and a transistor for bypass current adjustment, the drain and the gate of which are connected to the other end of the fourth resistor and a gate of the transistor for current bypass, and the source of which is connected to the ground terminal, and which functions as an input side element of the current mirror.

In addition, the current stabilizing circuit described above may comprises: a transistor for current bypass, the drain of which is connected to the high potential side terminal of the semiconductor element for clamp, and the source of which is connected to the ground terminal, and which functions as an output side element of a current mirror; a fourth resistor, one end of which is connected to the driving signal input terminal; a transistor for voltage adjustment, the drain and the gate of which are connected to the other end of the fourth resistor; and a transistor for bypass current adjustment, the drain and the gate of which are connected to a source of the transistor for voltage adjustment and a gate of the transistor for current bypass, and the source of which is connected to the ground terminal, and which functions as an input side element of the current mirror.

In addition, the current stabilizing circuit described above may comprises: a transistor for current bypass, the drain of which is connected to the high potential side terminal of the semiconductor element for clamp, and the source of which is connected to the ground terminal, and which functions as an output side element of a current mirror; a fourth resistor, one end of which is connected to the driving signal input terminal; a transistor for voltage adjustment, the drain of which is connected to the other end of the of the fourth resistor; a transistor for bypass current adjustment, the drain and the gate of which are connected to a source of the transistor for voltage adjustment and a gate of the transistor for current bypass, and the source of which is connected to the ground terminal, and which functions as an input side element of the current mirror; a fifth resistor connected between the driving signal input terminal and a gate of the transistor for voltage adjustment; and a sixth resistor connected between the gate of the transistor for voltage adjustment and the ground terminal.

In addition, an electronic circuit of the present invention comprises: a power semiconductor element, which has a control terminal and is formed on a semiconductor substrate; an overheat protection circuit, which is arranged between the control terminal of the power semiconductor element and a ground terminal, and is formed on the semiconductor substrate; a power supply for supplying a power to a load through the power semiconductor element; and a drive circuit for driving the power semiconductor element. Then, the overheat protection circuit or the like has characteristics as described above.

In the semiconductor device according to the present invention, an overcurrent protection circuit which constantly operates from a low input voltage to a high input voltage is arranged on the semiconductor substrate on which the power semiconductor element is formed, so that even when an input voltage to the semiconductor element becomes approximately 3 V or less, since a current which flows to the power semiconductor element is controlled so as to cut off at a constant overheat temperature protection value, a system LSI or a microcomputer which operates at a low voltage can drive the semiconductor device, thereby making it possible to drive it not only at a high input voltage of approximately 5 V as a conventional manner, but also at 3 V or less using various system LSIs and microcomputers in wide range. In addition, the power semiconductor element will be protected at the constant overheat temperature protection value against a fluctuation of the input voltage, thereby making it possible to improve reliability.

DETAILED DESCRIPTION OF THE PREFERRED EMBODIMENTS

First Embodiment

Figure 1:
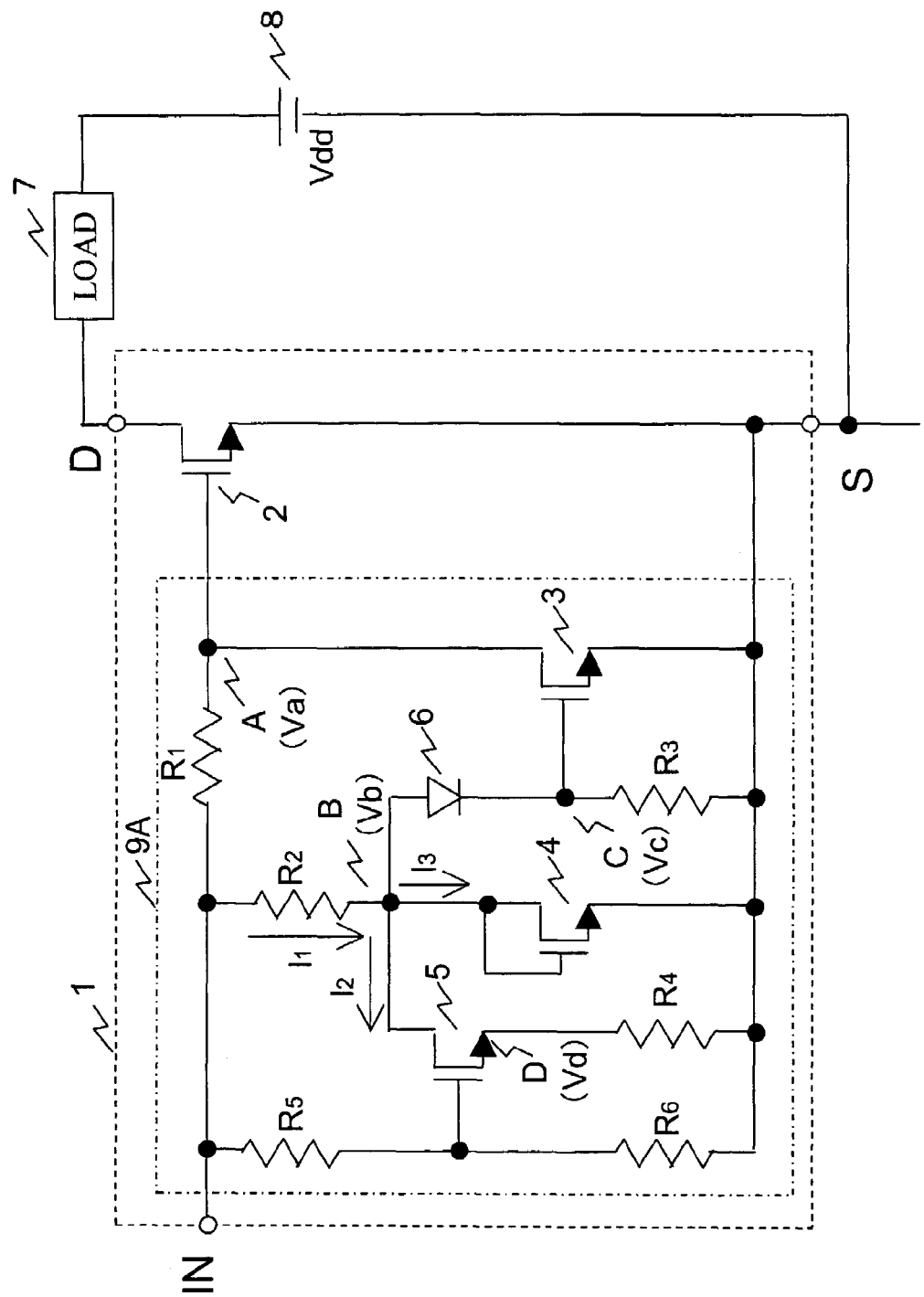
FIG. 1 is a circuit schematic diagram for explaining a semiconductor device according to a first embodiment of the present invention.

FIG. 1 is a circuit schematic diagram showing a configuration of a semiconductor device for power and an electronic circuit using the same of a first embodiment of the present invention. This semiconductor device for power controls an electric power supplied to a load 7 from a power supply 8 having a voltage of Vdd using a power semiconductor element 2 which is comprised of a vertical type power MOS FET. In order to protect the power semiconductor element 2, an overheat protection circuit 9A is formed on the same semiconductor substrate 1, on which the power semiconductor element 2 is formed.

The overheat protection circuit 9A includes a resistor R1 connected between a driving signal input terminal IN to which a drive circuit (not shown) μs connected, and a gate of the power semiconductor element 2, a resistor R2, one end of which is connected to the driving signal input terminal IN, and a transistor 4 connected to the resistor R2 in series.

A gate and a drain of the transistor 4 are connected to each other and connected to the other end of the resistor R2, and a source thereof is grounded. A voltage between the drain of the transistor 4 and a ground point has a voltage characteristic to be kept at an almost constant voltage in a wide temperature range. This voltage corresponds to a potential Vb of a point B shown in FIG. 1, and is hereafter referred to the potential Vb.

In a Japanese Laid-Open Patent Application Publication No. 63-229757 or the like, a zener diode is arranged thereto instead of the transistor 4 to thereby generate a constant voltage. On the contrary, under a diffusion condition for forming the power semiconductor element 2, concentrations of an N type impurity and a P type impurity implanted into the semiconductor substrate 1 becomes too high, so that a zener diode which generates a constant voltage of approximately 2 V, and the power semiconductor element 2 cannot be simultaneously formed on the semiconductor substrate 1.

In this embodiment, in order to operate it from a state where an input voltage is a low voltage value not more than 3 V, the transistor 4 is formed instead of the zener diode, and it is set so that the potential Vb may be a low voltage of approximately 1 to 2 V.

In addition, the other end of the resistor R2 is also connected to one end (anode) of a temperature sensing element 6 which is comprised of a series circuit of a plurality of polysilicon diodes, and the other end (cathode) of this temperature sensing element 6 is grounded via a resistor R3.

Herein, description will be made of an example of a temperature coefficient of a voltage across terminals of the transistor 4 and a voltage across terminals of the temperature sensing element 6. The voltages across the terminals of the transistor 4 are 2.068 V and 2.089 V at 25° C. and 125° C., respectively, and a temperature coefficient thereof is −21 mV/100° C. In addition, the voltages across the terminals of the temperature sensing element 6 are 2.24 V and 1.64 V at 25° C. and 125° C., respectively, and a temperature coefficient thereof is −600 mV/100° C. A difference between the temperature coefficients is approximately 30 times. The temperature coefficient of the voltage across the terminals of the transistor 4 is preferably further smaller than the above.

Moreover, a transistor 3 is arranged in the overheat protection circuit 9A. A drain and a source of this transistor 3 are connected to the gate of the power semiconductor element 2 and the ground point, respectively, and a gate thereof is connected to a node C of the temperature sensing element 6 and the resistor R3. Herein, when a temperature of the semiconductor substrate 1 reaches a predetermined overheat temperature protection value, a potential Vc of the point C is set so as to exceed a threshold voltage of the transistor 3.

In a configuration described above, when the semiconductor substrate 1 generates heat because of a large current flowing into the power semiconductor element 2, and the temperature of the semiconductor substrate 1 increases, the voltage across the terminals of the temperature sensing element 6 is reduced due to the fact that a forbidden band width of the polysilicon diode(s) which forms the temperature sensing element 6 becomes narrow.

On the other hand, a voltage between the high potential side terminal of the temperature sensing element 6 and the ground point is kept at an almost constant level irrespective of a temperature change of the semiconductor substrate 1 by the transistor 4 which is connected in parallel to a series circuit of the temperature sensing element 6 and the resistor 3. Consequently, the smaller the voltage across the terminals of the temperature sensing element 6 becomes, the higher the potential Vc of the point C becomes. Then, when the temperature of the semiconductor substrate 1 reaches the predetermined overheat temperature protection value, if the above potential Vc exceeds the threshold voltage of the transistor 3, the transistor 3 turns on, and a point A shown in FIG. 1 is grounded, so that a potential Va becomes 0 V.

In this case, since the potential Va of the point A is the same as the gate potential of the power semiconductor element 2, the power semiconductor element 2 will be in an off-state, and is protected from thermal destruction. The transistor 3 serves as a switch for turning the power semiconductor element 2 on and off in response to an output of the temperature sensing element 6.

In this embodiment, in order to operate a protecting operation at the same overheat protection temperature even when a voltage which is applied to the driving signal input terminal IN changes in a wide range of approximately 3 V through 6 V, //there is incorporated in the overheat protection circuit 9A a circuit for keeping a current which flows into the transistor 4 at an almost constant level even when the voltage which is applied to the driving signal input terminal IN changes. That reason is that, unless this circuit exists, when the voltage which is applied to the driving signal input terminal IN changes, the current which flows to the transistor 4 changes in connection with it, thereby changing the voltage across the terminals of the transistor 4 and changing the overheat protection temperature for cutting off the power semiconductor element 2.

Specifically, the circuit for keeping the current which flows into the transistor 4 at an almost constant level comprises a series circuit of the resistor R5 and a resistor R6 connected between the driving signal input terminal IN and the ground point, and a transistor 5, the gate of which is connected to a node of the resistor R5 and the resistor R6. The transistor 5 has a source which is grounded via the resistor R4, and a drain which is connected to the resistor R2, the transistor 4, and the temperature sensing element 6.

Figure 2:
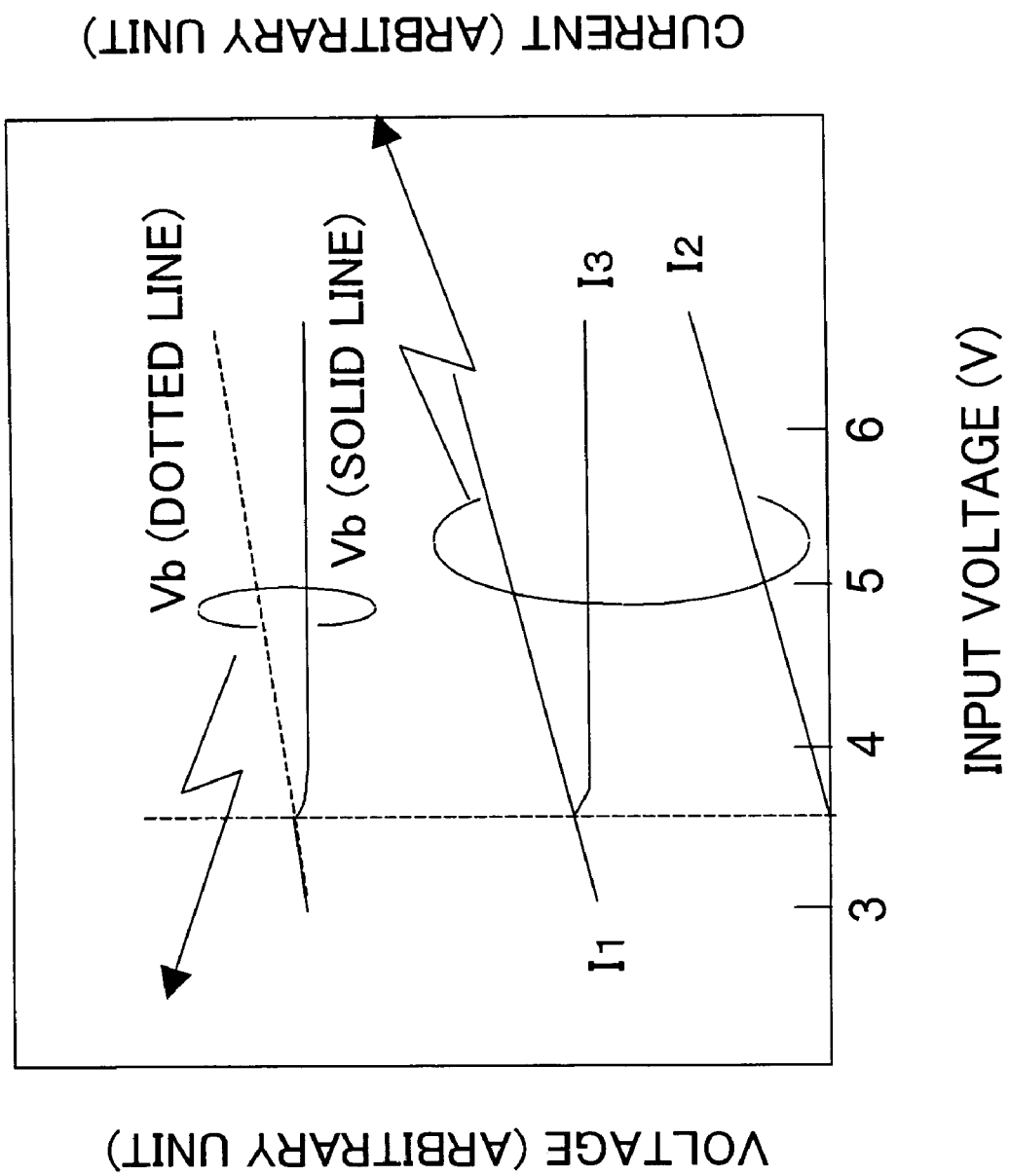
FIG. 2 is a characteristics chart of an overheat protection circuit in the semiconductor device according to the first embodiment of the present invention.

Referring to FIG. 2, description will be made of an operation of the overheat protection circuit 9A in this embodiment. When the input voltage to the driving signal input terminal IN is a low voltage (it is supposed to be 3 V), resistance values of the resistor R5 and R6 are set so that a voltage of a node of the resistor R5 and R6 may become not more than a threshold voltage of the transistor 5, and the transistor 5 may not operate.

When the input voltage of the driving signal input terminal IN is a low voltage (it is supposed to be 3 V), since the transistor 5 is off, as can be seen from FIG. 1, a current I1 which flows through the resistor R2 becomes the same as a current I3 which flows through the transistor 4, the potential Vb of the point B is the same as a drain-sources voltage of the transistor 4 determined by the current I3.

In this state, when a large current flows to the power semiconductor element 2 for the semiconductor substrate 1 to generate heat, the temperature of the semiconductor substrate 1 increases as described above, it is detected by the temperature sensing element 6, and the potential Vc of the point C increases. When the temperature of the semiconductor substrate 1 reaches the overheat temperature protection value, and this potential Vc exceeds the threshold voltage of the transistor 3, the transistor 3 turns on, the gate of the power semiconductor element 2 is grounded, and the power semiconductor element 2 will be in an off-state. As a result, the power semiconductor element 2 is protected from thermal destruction.

Next, a case where the voltage of the driving signal input terminal IN increases (it is supposed to be 5 V) is considered.

The current I1 which flows through the resistor R2 increases according to the input voltage increase applied to the driving signal input terminal IN. As a result, the current which flows through the transistor 4 also increases, and the potential Vb of the point B operates to be increased as shown symbol Vb (dotted line) in FIG. 2. On the contrary, since a gate voltage of the transistor 5 also increases by the increase of the voltage of the driving signal input terminal IN, if this becomes not less than the threshold voltage of the transistor 5, the transistor 5 will turn on and a current I2 will begin to flow to the transistor 5 as shown in FIG. 2. This current I2 is determined by a source potential of the transistor 5 (potential Vd of a point D) and the resistor R4.

The flow of this current I2 makes the current I3 which flows to the transistor 4 to be kept at an almost constant level as shown in FIG. 2. For this reason, even when the voltage of the driving signal input terminal IN increases, the potential vb is kept at an almost constant potential irrespective of changes of the voltage of the driving signal input terminal IN as shown symbol Vb (solid line) in FIG. 2.

As described above, as far as the potential vb is constant, since an amount of voltage fluctuation across the terminals of the temperature sensing element 6 and an amount of fluctuation of the potential Vc of the point C are kept at the same state as a case where the voltage of the driving signal input terminal IN is a low voltage, sensitivity of the temperature sensing element 6 to temperature changes, and by extension, gate potential fluctuation sensitivity of the transistor 3 do not change. Therefore, the power semiconductor element 2 is protected from thermal destruction at the same overheat temperature protection value irrespective of the changes of the voltage of the driving signal input terminal IN.

Generally, in order to reduce the input current, since the resistor R3 connected to the temperature sensing element 6 is set to a high resistance of, for example approximately one Mohm, a current which flows to the resistor R3 when the transistor 3 turns on is 1 V/1 Mohm=1 µA, when the threshold voltage of the transistor 3 is supposed to be 1 V, so that it is too small to be ignored as compared to the current I1. Therefore, the current which flows through the resistor R3 hardly affects fluctuation of the potential Vb.

According to this embodiment, the overheat protection circuit configured as above is arranged, so that even when the input voltage to the semiconductor element is reduced to be not more than approximately 3 V, the overheat temperature protection value can be kept at an constant level, thereby making it possible to protect the power semiconductor element from thermal destruction. Therefore, the power semiconductor element can be driven with system LSIs or microcomputers which operate at a low voltage. For this reason, it becomes possible to reduce power consumption of the electronic circuit including the semiconductor device of this embodiment.

In addition, according to this embodiment, since a drive circuit driven with the conventional high input voltage can also be used, it does not depend on a type of the drive circuit, thereby making it possible to be supported by one device.

Further, also when the input voltage is fluctuated due to abnormality of the drive circuit or the like, the power semiconductor element is protected at a constant overheat temperature protection value. Therefore, reliability of the semiconductor device and the electronic circuit using the same is significantly improved.

Second Embodiment

Figure 3:
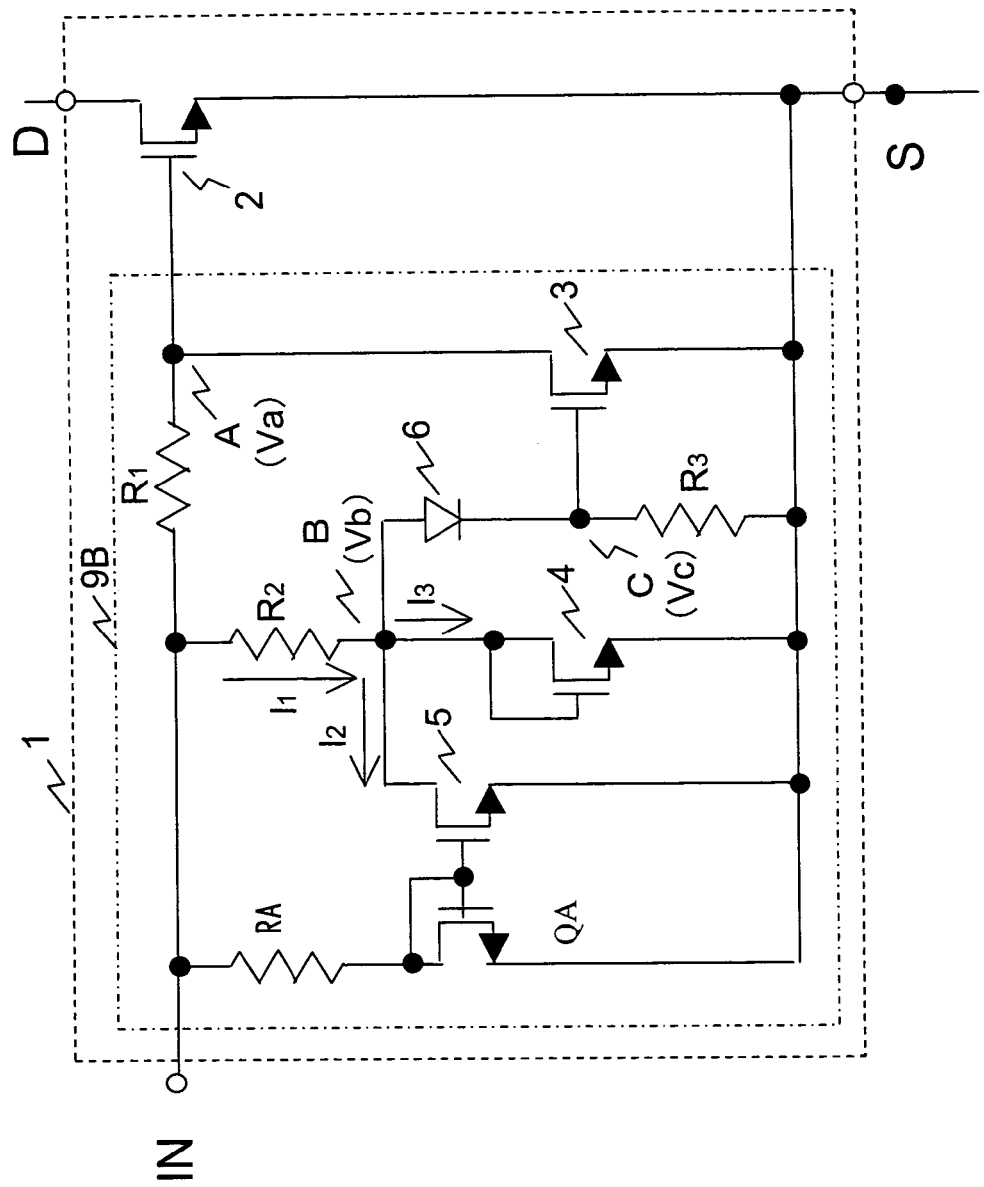
FIG. 3 is a circuit schematic diagram for explaining a semiconductor device according to a second embodiment of the present invention.

FIG. 3 is a circuit schematic diagram showing a configuration of a semiconductor device for power of a second embodiment of the present invention. An overheat protection circuit 9B is used for this second embodiment as a substitute for the overheat protection circuit 9A in FIG. 1. In order that this overheat protection circuit 9B may perform a constant overheat temperature protecting operation even when the input voltage to the driving signal input terminal IN has a wide voltage range including the voltage outside of 3 V through 5 V, both inclusive, for example a range of 1 V through 6 V, in the matter similar to the overheat protection circuit 9A, the current which flows to the transistor 4 is kept at an almost constant level.

This overheat protection circuit 9B is different in a part of the circuit configuration from the overheat protection circuit 9A. In other words, in this overheat protection circuit 9B, one end of a resistor RA is connected to the driving signal input terminal IN, a drain and a gate of a transistor QA are connected to the other end of the resistor RA, and a source of the transistor QA is connected to the ground point. In addition, the drain of the transistor 5 is connected to the other end of the resistor R2, the drain and the gate of the transistor 4, and the high potential side terminal of the temperature sensing element 6, the gate of the transistor 5 is connected to the drain and the gate of the transistor QA, and the source of the transistor 5 is grounded. Then, the transistor QA and the transistor 5 form a current mirror. Other configurations are similar to those of the overheat protection circuit 9A in FIG. 1.

In this overheat protection circuit 9B, when the input voltage to the driving signal input terminal IN is a low voltage, the input voltage to the driving signal input terminal IN becomes not more than the threshold voltage of the transistor 5, so that the transistor 5 does not operate.

The threshold voltage of the transistor 5 is decided according to a lower limit of the input voltage. For example, when a lower limit of the input voltage range is 1 V, the threshold voltage of the transistor 5 will also be set at approximately 1 V.

In a case of a low voltage (it is supposed to be 1 V), since the transistor 5 is off, as can be seen from FIG. 3, the current I1 which flows through the resistor R2 becomes the same as the current I3 which flows through the transistor 4, and the potential Vb of the point B is the same as the drain-sources voltage of the transistor 4 determined by the current I3.

In this state, when the semiconductor substrate 1 generates heat due to a large current flowing into the power semiconductor element 2, and the temperature of the semiconductor substrate 1 increases, it is detected by the temperature sensing element 6, and the potential Vc of the point C increases. When the temperature of the semiconductor substrate 1 reaches the overheat temperature protection value, and this potential Vc exceeds the threshold voltage of the transistor 3, the transistor 3 turns on, the gate of the power semiconductor element 2 is grounded, and the power semiconductor element 2 will be in an off-state. As a result, the power semiconductor element 2 is protected from thermal destruction.

Next, a case where the voltage of the driving signal input terminal IN increases (it is supposed to be 5 V) is considered.

The current I1 which flows through the resistor R2 increases according to the input voltage increase applied to the driving signal input terminal IN. As a result, the current which flows to the transistor 4 also increases, and the voltage Vb of the point B operates to be increased as shown symbol Vb (dotted line) in FIG. 2. On the contrary, due to the increase of the voltage of the driving signal input terminal IN, in the transistor 5 and the transistor QA both having a common gate, a gate potential thereof increases exceeding the threshold potential, the transistor 5 and the transistor QA turn on, and a current begins to flow through the current mirror. At this time, a current according to a resistance of the resistor RA flows to the transistor QA. As a result, a current determined by a mirror ratio to the transistor QA flows through the transistor 5 having the gate common to that of the transistor QA as the drain current I2 of the transistor 5.

The flow of this current I2 makes the current I3 which flows to the transistor 4 to be kept at almost constant level as shown in FIG. 2. For this reason, even when the voltage of the driving signal input terminal IN increases, the potential Vb is at an almost constant potential with respect to changes of the voltage of the driving signal input terminal IN as shown symbol Vb (solid line) in FIG. 2.

As described above, when the potential Vb is constant, since an amount of voltage fluctuation across the terminals of the temperature sensing element 6 and an amount of fluctuation of the potential Vc of the point C are kept at the same state as a case where the voltage of the driving signal input terminal IN is a low voltage, sensitivity of the temperature sensing element 6 to temperature changes, and by extension, gate potential fluctuation sensitivity of the transistor 3 do not change. Therefore, the power semiconductor element 2 is protected from thermal destruction at the same overheat temperature protection value irrespective of the changes of the voltage of the driving signal input terminal IN. Other points are similar to those of the overheat protection circuit 9A.

According to this configuration, the second embodiment has an effect similar to that of the first embodiment of the present invention.

Moreover, according to this embodiment, following advantages are given.

In the first embodiment, when the input voltage changes from a high voltage to a low voltage in a step shape or the like, a signal directly corresponding to the voltage change is supplied to the gate of the transistor 5, so that it rapidly changes from a non-conduction state to a conduction state. As a result, the potential Vb is also fluctuated rapidly, the overheat protection operation may become unstable until the potential is stabilized.

On the other hand, according to this embodiment, when the input voltage changes rapidly, the transistor QA and the transistor 5 begin to turn on, and at this time, as the signal supplied to the gate of each transistors QA and 5, a value which is decreased by a voltage drop due to the resistor RA is supplied thereto. Therefore, compared with a case of the first embodiment, the potential Vb of the point B changes gradually, thereby improving stability of the overheat protection operation.

Third Embodiment

Figure 4:
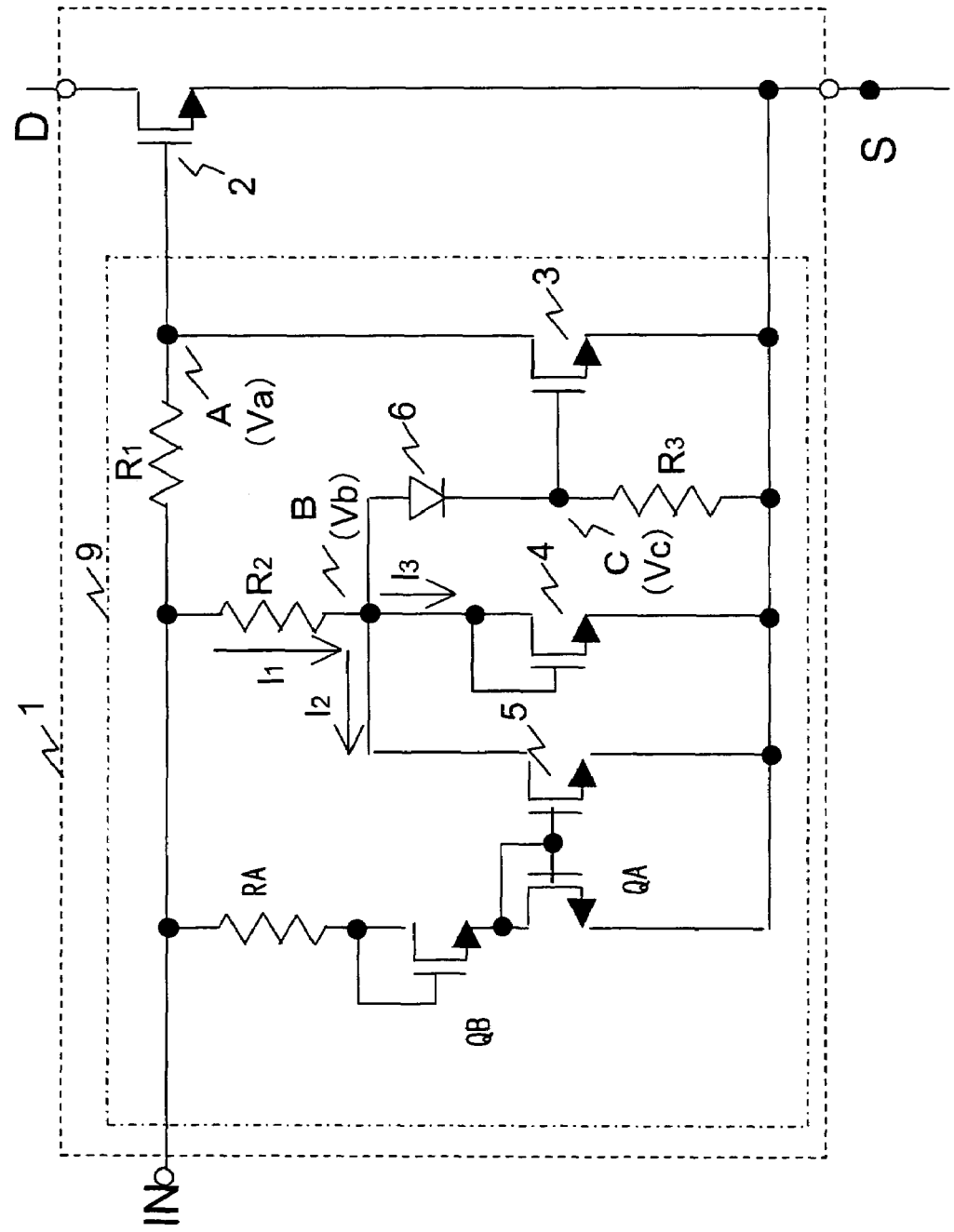
FIG. 4 is a circuit schematic diagram for explaining a semiconductor device according to a third embodiment of the present invention.

FIG. 4 is a circuit schematic diagram showing a configuration of a semiconductor device for power of a third embodiment of the present invention.

An overheat protection circuit 9C is used for this third embodiment as a substitute for the overheat protection circuit 9B in FIG. 3. This overheat protection circuit 9C is configured such that a transistor QB having a gate and a drain which are commonly connected is connected between the transistor QA and the resistor RA of FIG. 3, and when the input voltage to the driving signal input terminal IN is not more than a sum of the threshold voltage of the transistor 5 and the threshold voltage of the transistor QB, the transistor 5 does not operate, so that the input voltage, at which the overheat protection temperature constant control operates, can be made higher than that of the embodiment of FIG. 3.

According to this configuration, effect in the matter similar to that of the first embodiment and the second embodiment of the present invention can be obtained.

Forth Embodiment

Figure 5:
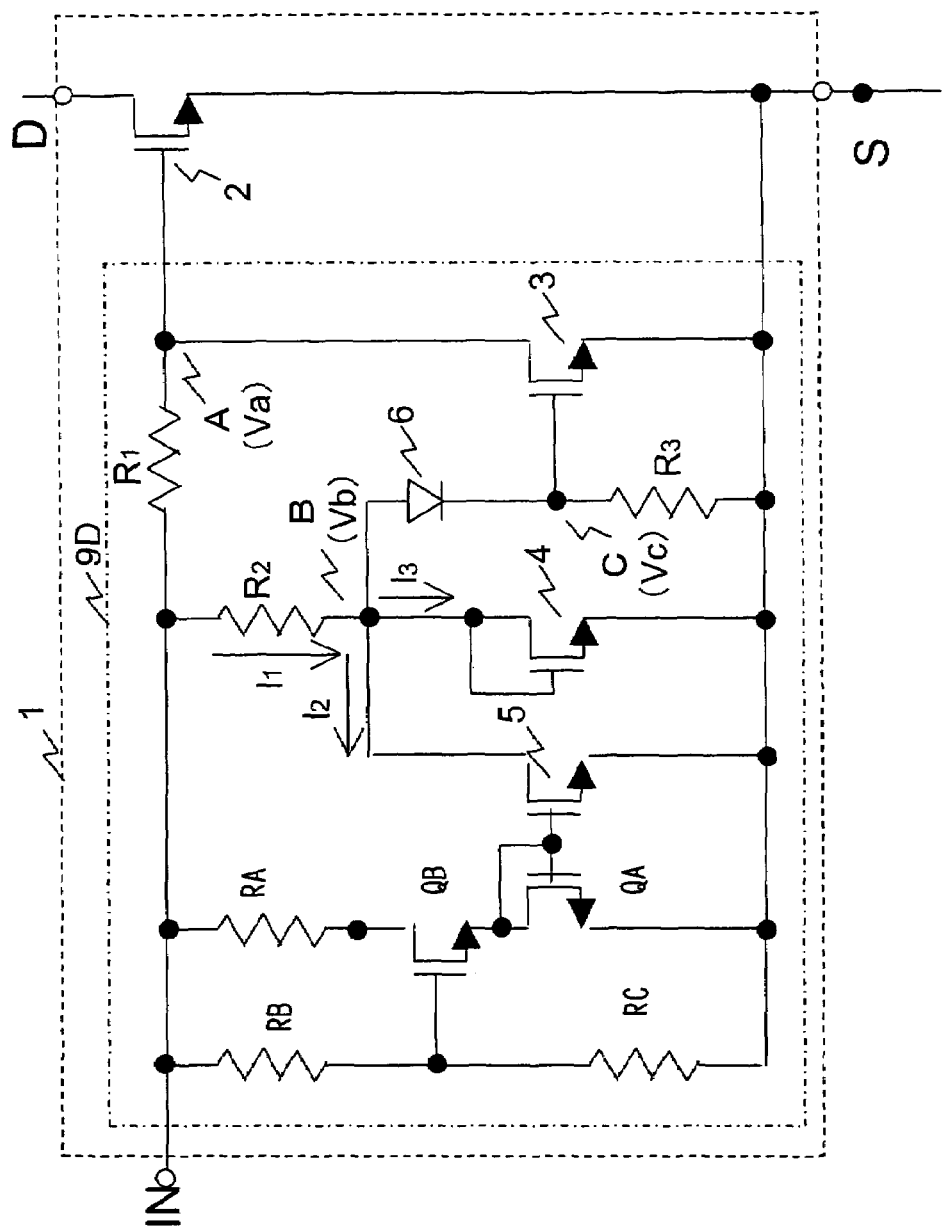
FIG. 5 is a circuit schematic diagram for explaining a semiconductor device according to a forth embodiment of the present invention.
Figure 6:
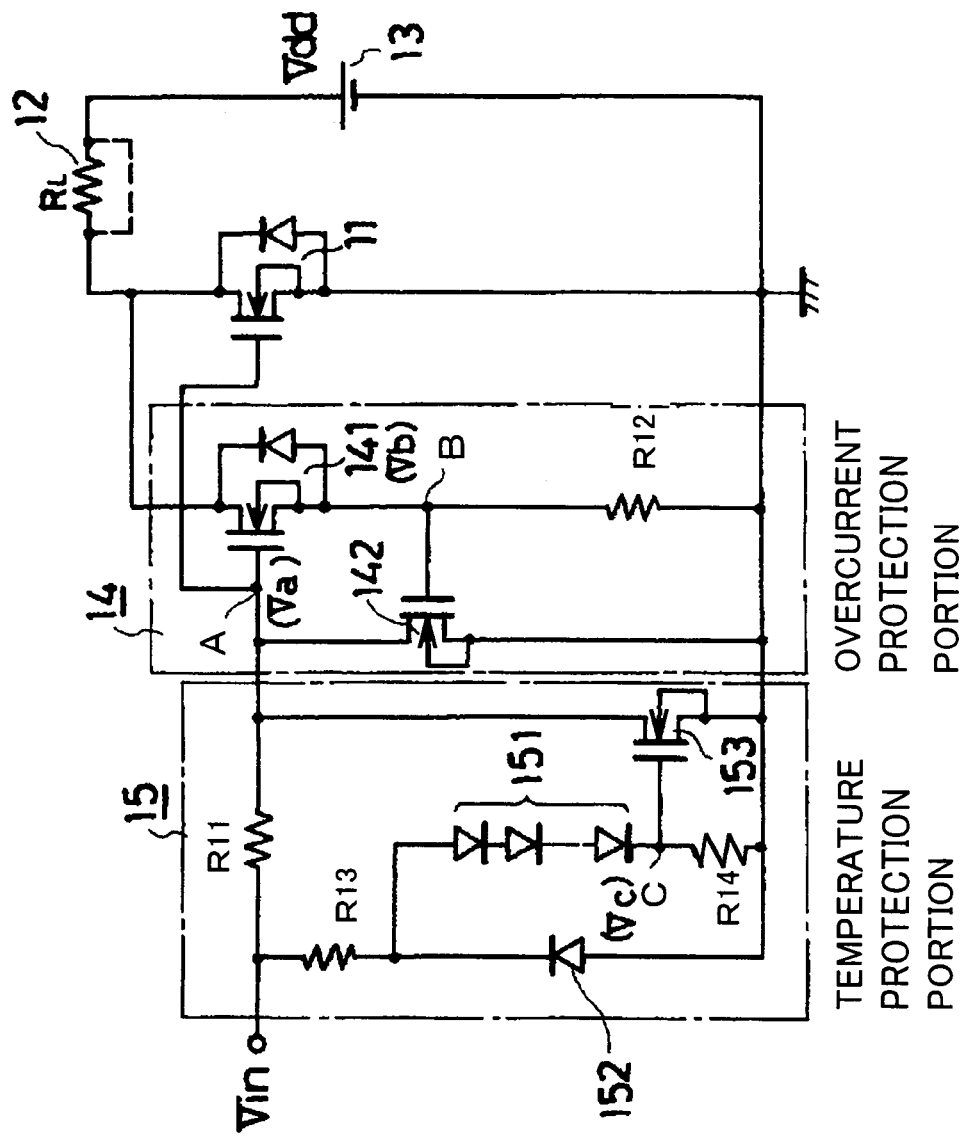
FIG. 6 is a circuit schematic diagram for explaining a semiconductor device according to a prior art.

FIG. 5 is a circuit schematic diagram showing a configuration of a semiconductor device for power of a forth embodiment of the present invention.

An overheat protection circuit 9D is used for this fourth embodiment as a substitute for the overheat protection circuit 9B in FIG. 3. This overheat protection circuit 9D is configured such that the transistor QB is connected between the transistor QA and the resistor RA of FIG. 3, a series circuit of resistors RB and RC is connected between the driving signal input terminal IN and the ground point, a gate of the transistor QB is connected to a node of the resistors RB and RC, and when a voltage which is given by dividing the input voltage to the driving signal input terminal IN by the resistor RB and the resistor RC is not more than a sum of the threshold voltage of the transistor 5 and a threshold voltage of the transistor QB, the transistor 5 does not operate, so that the input voltage, at which the overheat protection temperature constant control operates, can be made higher than that of each of the embodiments of FIG. 3 and FIG. 4.

According to this configuration, effect in the matter similar to that of the first embodiment and the second embodiment of the present invention can be obtained.

Incidentally, in this embodiment, although the power semiconductor element 2, the transistors 3, 4, and 5 are formed of the N channel MOS FETs, respectively, it may be configured using the P channel MOS FETs in the matter similar to that.

The power semiconductor element 2 may be a high withstand voltage N channel DMOS FET which uses an N type silicon substrate as a drain electrode, or a high withstand voltage P channel DMOS FET which uses a P type silicon substrate as the drain electrode. Further, the power semiconductor element 2 may be a bipolar transistor.

Further, the load, the type of the power supply, and the drive circuit connected to the driving signal input terminal IN are not limited in particular.

What is claimed is:

1. A semiconductor device, comprising:
    a power semiconductor element, which has a control terminal and is disposed on a semiconductor substrate; and
    an overheat protection circuit, which is arranged between the control terminal of said power semiconductor element and a ground terminal, and is disposed on said semiconductor substrate, wherein:
    said overheat protection circuit comprises:
        a driving signal input terminal, to which a driving signal for driving said power semiconductor element is supplied;
        a first resistor connected between said driving signal input terminal and the control terminal of said power semiconductor element;
        a second resistor, one end of which is connected to said driving signal input terminal;
        a semiconductor element for temperature sensing, which has a high potential side terminal connected to the other end of said second resistor, and has a low potential side terminal, and changes a voltage across the high potential side terminal and the low potential terminal according to a temperature change of said semiconductor substrate;
        a third resistor connected between the low potential side terminal of said semiconductor element for temperature sensing and said ground terminal;
        a semiconductor element for switching, which has a control terminal connected to the low potential side terminal of said semiconductor element for temperature sensing, and has two main terminals connected to the control terminal of said power semiconductor element and said ground terminal, respectively;
        a semiconductor element for clamp, which has a high potential side terminal connected to the other end of said second resistor, and has a low potential side terminal connected to said ground terminal, and keeps a voltage between the high potential side terminal of said semiconductor element for temperature sensing and said ground terminal at an almost constant voltage; and
        a current stabilizing circuit, which keeps a current flow amount into the high potential side terminal of said semiconductor element for clamp at an almost constant level, and
    said current stabilizing circuit comprises:
        a transistor for current bypass, the drain of which is connected to the high potential side terminal of said semiconductor element for clamp;
        a fourth resistor connected between a source of said transistor for current bypass and said ground terminal;
        a fifth resistor connected between said driving signal input terminal and a gate of said transistor for current bypass; and
        a sixth resistor connected between the gate of said transistor for current bypass and said ground terminal.

2. A semiconductor device, comprising:
    a power semiconductor element, which has a control terminal and is disposed on a semiconductor substrate; and
    an overheat protection circuit, which is arranged between the control terminal of said power semiconductor element and a ground terminal, and is disposed on said semiconductor substrate, wherein:
    said overheat protection circuit comprises:
        a driving signal input terminal, to which a driving signal for driving said power semiconductor element is supplied;
        a first resistor connected between said driving signal input terminal and the control terminal of said power semiconductor element;
        a second resistor, one end of which is connected to said driving signal input terminal;
        a semiconductor element for temperature sensing, which has a high potential side terminal connected to the other end of said second resistor, and has a low potential side terminal, and changes a voltage across the high potential side terminal and the low potential terminal according to a temperature change of said semiconductor substrate;
        a third resistor connected between the low potential side terminal of said semiconductor element for temperature sensing and said ground terminal;
        a semiconductor element for switching, which has a control terminal connected to the low potential side terminal of said semiconductor element for temperature sensing, and has two main terminals connected to the control terminal of said power semiconductor element and said ground terminal, respectively;
        a semiconductor element for clamp, which has a high potential side terminal connected to the other end of said second resistor, and has a low potential side terminal connected to said ground terminal, and keeps a voltage between the high potential side terminal of said semiconductor element for temperature sensing and said ground terminal at an almost constant voltage; and a current stabilizing circuit, which keeps a current flow amount into the high potential side terminal of said semiconductor element for clamp at an almost constant level, and said current stabilizing circuit comprises:
- a transistor for current bypass, the drain of which is connected to the high potential side terminal of said semiconductor element for clamp, and the source of which is connected to said ground terminal, and which functions as an output side element of a current mirror;
- a fourth resistor, one end of which is connected to said driving signal input terminal; and
- a transistor for bypass current adjustment, the drain and the gate of which are connected to the other end of said fourth resistor and a gate of said transistor for current bypass, and the source of which is connected to said ground terminal, and which functions as an input side element of said current mirror.

3. The semiconductor device according to claim 2, wherein said current stabilizing circuit comprises a transistor for voltage adjustment inserted and connected between said fourth resistor and said transistor for current bypass, the drain and the gate of said transistor for voltage adjustment are connected to the other end of said fourth resistor, and the source of said transistor for voltage adjustment is connected to the gate of said transistor for current bypass.

4. The semiconductor device according to claim 2, wherein said current stabilizing circuit further comprises:
- a transistor for voltage adjustment inserted between said fourth resistor and said transistor for current bypass, the drain of which is connected to the other end of said fourth resistor, and the source of which is connected to the gate of said transistor for current bypass;
- a fifth resistor connected between said driving signal input terminal and a gate of said transistor for voltage adjustment; and
- a sixth resistor connected between the gate of said transistor for voltage adjustment and said ground terminal.

5. The semiconductor device according to claim 1, further comprising:
- a power supply for supplying a power to a load through said power semiconductor element; and
- a drive circuit for driving said power semiconductor element, wherein
- a driving signal for driving said power semiconductor element is supplied from said drive circuit to said driving signal input terminal of said overheat protection circuit.

6. The semiconductor device according to claim 2, further comprising:
- a power supply for supplying a power to a load through said power semiconductor element; and
- a drive circuit for driving said power semiconductor element, wherein:
- a driving signal for driving said power semiconductor element is supplied from said drive circuit to said driving signal input terminal of said overheat protection circuit.

7. The semiconductor device according to claim 3, further comprising:
- a power supply for supplying a power to a load through said power semiconductor element; and
- a drive circuit for driving said power semiconductor element, wherein:
- a driving signal for driving said power semiconductor element is supplied from said drive circuit to said driving signal input terminal of said overheat protection circuit.

8. The semiconductor device according to claim 4, further comprising:
- a power supply for supplying a power to a load through said power semiconductor element; and
- a drive circuit for driving said power semiconductor element, wherein:
- a driving signal for driving said power semiconductor element is supplied from said drive circuit to said driving signal input terminal of said overheat protection circuit.

9. The semiconductor device according to claim 5, wherein said drive circuit comprises a microcomputer or an LSI.

10. The semiconductor device according to claim 6, wherein said drive circuit comprises a microcomputer or an LSI.

11. The semiconductor device according to claim 7, wherein said drive circuit comprises a microcomputer or an LSI.

12. The semiconductor device according to claim 8, wherein said drive circuit comprises a microcomputer or an LSI.

13. The semiconductor device according to claim 1, wherein when said semiconductor element for switching turns on, a potential of the control terminal of said power semiconductor element is lowered, and operation of said power semiconductor element is stopped.

14. The semiconductor device according to claim 5, wherein when said semiconductor element for switching turns on, a potential of the control terminal of said power semiconductor element is lowered, and operation of said power semiconductor element is stopped.

15. The semiconductor device according to claim 6, wherein when said semiconductor element for switching turns on, a potential of the control terminal of said power semiconductor element is lowered, and operation of said power semiconductor element is stopped.

16. The semiconductor device according to claim 7, wherein when said semiconductor element for switching turns on, a potential of the control terminal of said power semiconductor element is lowered, and operation of said power semiconductor element is stopped.

17. The semiconductor device according to claim 8, wherein when said semiconductor element for switching turns on, a potential of the control terminal of said power semiconductor element is lowered, and operation of said power semiconductor element is stopped.

18. The semiconductor device according to claim 1, wherein said semiconductor element for clamp is a transistor, the drain and the gate of which are commonly connected.

19. The semiconductor device according to claim 5, wherein said semiconductor element for clamp is a transistor, the drain and the gate of which are commonly connected.

20. The semiconductor device according to claim 6, wherein said semiconductor element for clamp is a transistor, the drain and the gate of which are commonly connected.

21. The semiconductor device according to claim 7, wherein said semiconductor element for clamp is a transistor, the drain and the gate of which are commonly connected.

22. The semiconductor device according to claim 8, wherein said semiconductor element for clamp is a transistor, the drain and the gate of which are commonly connected.

* * * * *